United States Patent [19]

Lynn

[11] Patent Number: 5,251,054

[45] Date of Patent: Oct. 5, 1993

[54] LAN ELECTRO-OPTICAL INTERFACE

[75] Inventor: Mark A. Lynn, Warren, Ohio

[73] Assignee: General Motors Corporation, Detroit, Mich.

[21] Appl. No.: 782,177

[22] Filed: Oct. 24, 1991

[51] Int. Cl.$^5$ .................. H04B 10/06; H04B 10/20
[52] U.S. Cl. ............................... 359/189; 359/118; 250/214 A; 307/475; 330/59
[58] Field of Search ............ 359/189, 154, 118, 158; 250/214 A, 214 B; 330/59, 308; 307/475

[56] References Cited

U.S. PATENT DOCUMENTS

| | | | |
|---|---|---|---|
| 3,766,406 | 10/1973 | Bryant et al. | 307/475 |
| 4,330,870 | 5/1982 | Arends | 455/617 |
| 4,694,504 | 9/1987 | Porter et al. | 455/608 |
| 4,701,904 | 10/1987 | Darcie | 370/3 |
| 4,731,880 | 3/1988 | Ault et al. | 455/607 |
| 4,743,856 | 5/1988 | Keating | 250/214 B |
| 4,850,042 | 7/1989 | Petronio et al. | 455/606 |
| 4,903,338 | 2/1990 | Funke | 455/607 |
| 5,068,550 | 11/1991 | Barre | 307/475 |

Primary Examiner—Richard E. Chilcot, Jr.
Assistant Examiner—Kinfe-Michael Negash
Attorney, Agent, or Firm—Anthony Luke Simon

[57] ABSTRACT

A receiver circuit for a LAN electro-optical interface includes a high pass filter connected between the optical signal receiving element and the standard ECL line receiver. The high pass filter removes noise from the signal output by the optical signal receiving element, thereby reducing the bit error rate of the system and/or increasing the effective sensitivity of the system, enabling the signal transmission distance to be increased.

4 Claims, 2 Drawing Sheets

LAN ELECTRO-OPTICAL INTERFACE

The subject of this specification is related to copending application U.S. Ser. No. 07/782,176, entitled "LAN Electro-Optical Interface," filed concurrently with this application, assigned to the assignee of this application, and incorporated herein by reference.

This invention relates to local area network interfaces and more particularly to an improved electro-optical receiver for a local area network interface.

BACKGROUND OF THE INVENTION

Many computer-based information systems utilize communication configurations known as Local Area Networks (LANs). Data communication in LAN systems may be implemented in various ways, including using light-wave communication. LAN light-wave communication systems typically utilize light emitting diodes (LEDs) or semiconductor lasers as light sources for a fiber-optic communications network, from which optical receivers receive the light-wave information carrying the system data.

In LAN light-wave communication systems, the speed, quality, and distance of data transfer between sending and receiving units may be limited by characteristics, such as response sensitivity, of the system components. Effective sensitivity of an electro-optical receiver may be defined as the optical power level incident upon the receiver where the recovered bit stream has a bit error rate (BER) of $10^{-9}$ or better. FIG. 1 shows a prior art receiver, which, when used with the LAN electro-optical interface transmitter of the above-mentioned copending application, U.S. Ser. No. 07/782,176, has an effective receiving distance of about 65 meters for a 660 nm plastic optical fiber (POF) system using a polymethylmethacrylate (PMMA) fiber.

What is desired, is a LAN electro-optical interface system with improved data reception sensitivity, allowing for increased data transmission distance between light-wave transmitting and receiving units.

SUMMARY OF THE INVENTION

This invention provides a receiver circuit for a LAN electro-optical interface system which is able to increase the effective sensitivity of the interface system by 6.25 dB over a standard receiver circuit. The increase in effective sensitivity of the receiver circuit of this invention allows for an increase in the effective receiving distance of the receiver from about 65 meters to as much as 90 meters in the 660 nm PMMA POF system. This invention achieves its benefits using low cost circuit components.

This invention improves the sensitivity of the receiver circuit by immediately filtering the output of the electro-optical analog receiver of the circuit to remove any low frequency noise which may have coupled onto the light-wave signal or into the receiver. This filter reduces the bit error rate caused by noise, increasing the sensitivity of the system. In a preferred implementation of this invention, a low noise and high gain-bandwidth amplifier is added to the circuit. The amplifier amplifies the filtered signal, further increasing the sensitivity of the receiver.

Structurally, this invention comprises a high pass filter coupled between an analog optical signal receiver and a standard receiver circuit, providing an increase in sensitivity for the receiver. In a preferred implementation of this invention, a high gain, low noise transistor amplifier is coupled between the high pass filter and the standard receiver circuit, providing an even greater increase in sensitivity of the receiver.

DETAILED DESCRIPTION OF THIS INVENTION

Figure 1:
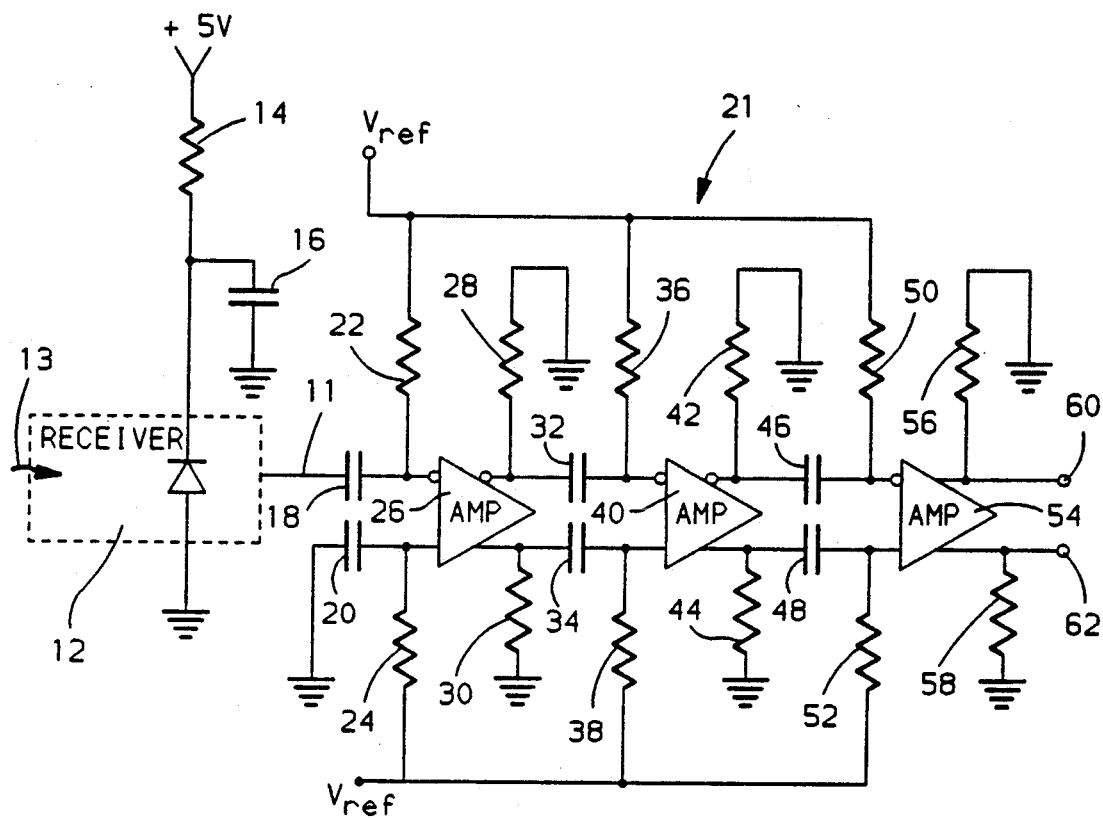
FIG. 1 is a circuit diagram of a prior art LAN electro-optical receiver circuit.
Figure 2:
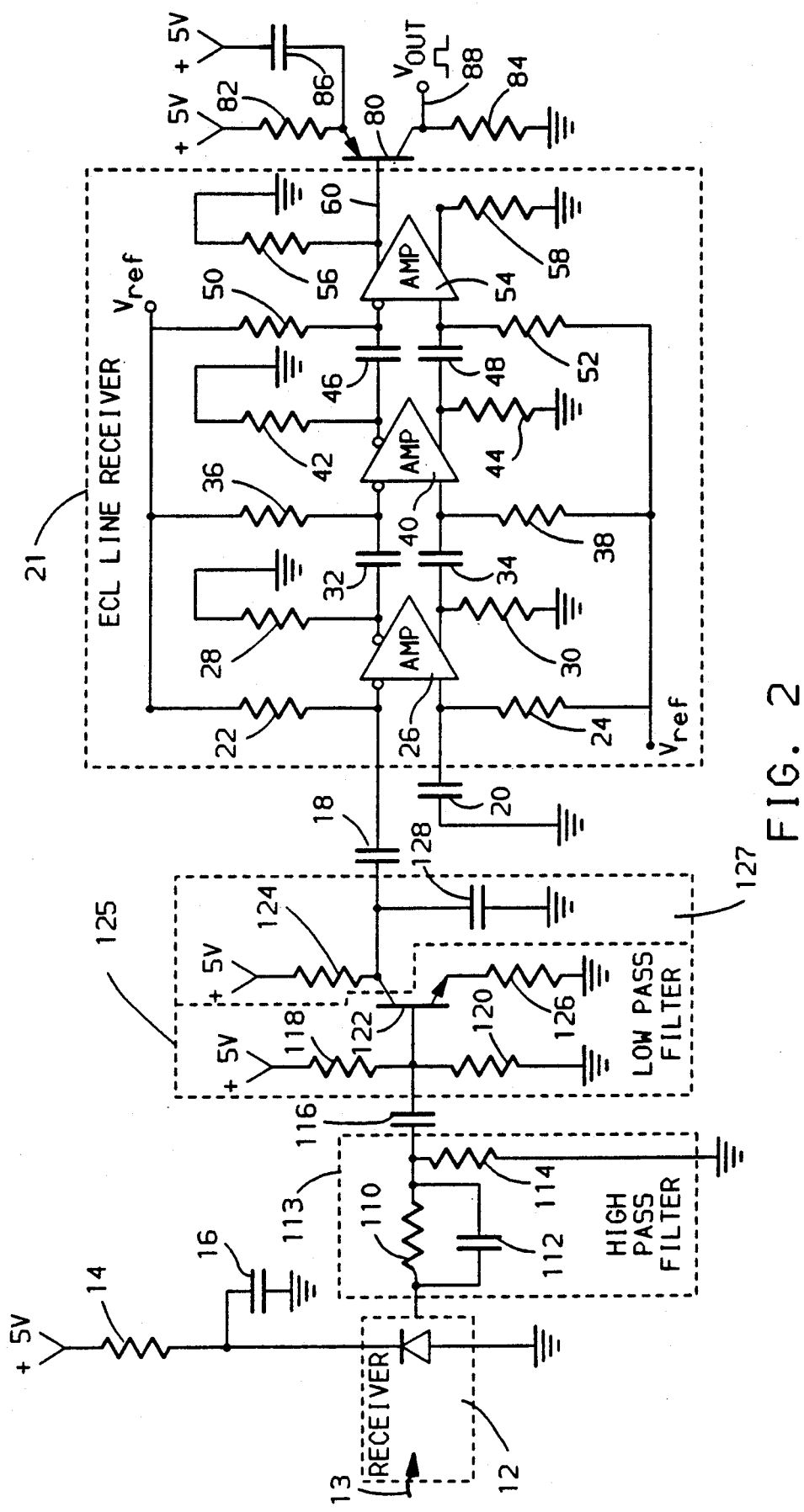
FIG. 2 is a circuit diagram of a preferred implementation of this invention.

Referring to FIG. 2, the circuit of this invention includes first order high pass filter 13 coupled between a standard analog receiver 12 and a standard LAN electro-optical receiver circuit comprising a three stage ECL line receiver circuit 21, which includes amplifiers 26, 40 and 54 and related circuitry. The analog receiver 12 and the standard circuitry including amplifiers 26, 40 and 54, described in detail below, operate in substantially the same manner as in the prior art circuit shown in FIG. 1.

Analog receiver 12 includes a PIN photodiode and a preamplifier, both of which may be packaged together in a single part, such as in Hewlett Packard TM part no. QFBR2584. Analog receiver 12 is coupled to a five volt power supply through resistor 14 (10 Ω). Capacitor 16 (0.1 uF) filters fluctuations in the five volt power source. Analog receiver 12 receives light-wave data signals 13 from a fiber-optic network and outputs an electrical signal on line 11 corresponding to the amplitude of the light wave data signal 13.

In a conventional system such as the system shown in FIG. 1, the signal output by analog receiver 12 is coupled directly to the three stage ECL line receiver 21, through AC coupling capacitors 18 and 20. According to this invention, high pass filter 113 (FIG. 2), a first order high pass filter, is added, coupling the signal on line 11 to the ECL line receiver 21.

The important criteria for high pass filter 113 is the ability to greatly attenuate any low frequency noise while passing all signal components without attenuation. High pass filter 113 consists of a parallel resistor-capacitor network, comprising resistor 110 (220 Ω) and capacitor 112 (0.033 uF), and resistor 114 (50 Ω) coupled to ground. Filter 113 has a transfer function with a single pole and a single zero. The zero $((R_{110}R_{114}C_{112})s+1)$ acts on the low frequency components. The break frequency for the zero is $1/(2R_{110}R_{114}C_{112})$, which for the values given is 438 Hz. The pole of the filter $((R_{110}R_{114}C_{112})s+R_{110}+R_{114})$ has its break frequency at $1/(2C_{112}((R_{110}R_{114})/(R_{110}+R_{114}))$, which, for the values chosen, is 118 KHz.

At frequencies below the zero break frequency, the attenuation of filter 113 is approximately $20\log(1/(R_{110}+R_{114}))$ At frequencies above the zero break frequency and below the pole break frequency, the filter decreases attenuation by 10 db/decade. At frequencies above the pole break frequency, the transfer function of filter 113 is approximately 1. The change in transfer function is gradual at the break frequencies. For example, at the 118 KHz break frequency, signal attenuation is still 3 Db. However, at 1 MHz, signal attenuation is substantially 1. As a result, filter 113 passes both a 1 MHz Ethernet idle signal (specified in the Fiber Optic Inter Repeater Link (FOIRL) segment of the IEEE 802.3 specification) and a 10 MBd Manchester encoded data signal unattenuated.

Other suitable signal formats can be used with the system. With the information set forth herein, those skilled in the art can easily adjust the filter pole and zero to accompany different signal frequencies.

High pass filter 113 eliminates low frequency noise that couples onto the receiver output and degrades signal quality. Major sources for the low frequency noise include power supply noise, which couples into the receiver through the power feed, ground noise caused by other circuits on the board, capacitively coupled noise onto the output trace from nearby traces, and noise generated by the receiving diode within analog receiver 12. Noise generated by the receiving diode includes thermal noise, shot noise, and response to light coupled into the fiber-optic line that does not represent the data signal. Each of these noise sources reduces the signal to noise ratio and, therefore, the sensitivity of the system. The noise level in an unfiltered system, such as in FIG. 1, is approximately 1.01 mV, while, in the filtered system, is approximately 558 uV.

The addition of high pass filter 113 improves the effective sensitivity of the receiver circuit by 2.5 dB and increases the maximum transmission-reception distance from 65 meters to 75 meters, (example distances are distances achieved when used with the transmitter of copending application U.S. Ser. No. 07/782,176. Although second order filters or higher may be used, the filter shown is the preferred implementation.

In the preferred implementation of this invention, the output of the high pass filter 113 is AC coupled, through capacitor 116 (0.001 uF), to amplifier 125. Amplifier 125 includes transistor 122, biasing resistors 118 (2.5 K$\Omega$) and 120 (550 $\Omega$), resistor 124 (1 K$\Omega$) resistor 126 (50 $\Omega$) and capacitor 128 (22 pF). Transistor 122 is a 2N2222, for cost reasons, but may be a CA3127 transistor, having a very low noise figure and a high gain-bandwidth product to maximize the useful gain of the transistor while minimizing noise introduced by the amplifier. With the values given, the amplifier has a gain of eighty.

Because of the low noise in the signal input into the amplifier 125 and the relatively low noise figure of transistor 122, amplifier 125 amplifies the output of the high pass filter 113 with minimum increase in the bit error rate of the circuitry. However, some high frequency noise is introduced by the switching of transistor 122. Amplifier 125 allows a weaker signal to be received by analog receiver 12 and to be transmitted as a stronger signal to ECL line receiver 21 with integrity.

Resistor 124 and capacitor 128 comprise a low pass filter 127 at the output of amplifier 125 reducing the high frequency noise of the system. Low pass filter 127 has a single pole ($s(R_{124}C_{128})$) having a break frequency at $1/(R_{124}C_{128})$ which for the values chosen, is 7.2 MHz. Above 7.2 MHz, signals experience increased attenuation at 10 db/decade. Filter 127 allows the 1 MHz idle signal and the 10 MBd data signal (which is equivalent to a 5 MHz signal since it has a 50% duty cycle) to pass substantially unattenuated, while filtering out higher frequency noise signals. Higher frequency noise signals may be caused by switching of transistors in the system.

The overall effect of filters 113 and 127 is to create a band pass filter passing signals from approximately 200 KHz to 7 MHz while severely attenuating all other signals. The placement of filters 113 and 127 with respect to amplifier 125 provide some additional advantages. Filter 113 filters out low frequency noise so that it is not amplified by amplifier 125. Noise introduced into the system by amplifier 125 tends to be high frequency transistor switching noise. The placement of low pass filter 127 at the output of transistor amplifier 125, as opposed to the input provides the system with the desired band pass filter effect while also providing filtering of high frequency transistor switching noise, part of which may be generated by transistor 122.

With the addition of transistor amplifier 125 and low pass filter 127, the effective sensitivity of the circuit is increased by an additional 3.75 dB, enabling a transmission-reception distance of up to 90 meters.

The output of amplifier 125 is coupled via AC coupling capacitors 18 (1 uF) and 20 (0.1 uF) to the three stage ECL line receiver 21. ECL line receiver 21 comprises three amplification stages centered around the three amplifiers 26, 40 and 54. Each amplification stage of the ECL line receiver 21 amplifies and squares the input signal to that stage. The amplifiers 26, 40 and 54 are all included in a standard Motorola TM MC10116 ECL line receiver chip. External resistors 22, 24, 36, 38, 50 and 52 are all identical (1 K$\Omega$). Likewise, external resistors 28, 30, 42, 44, 56 and 58 are all identical (510 $\Omega$). The three stages of the ECL line receiver 21 are AC coupled via external capacitors 32, 34, 46, and 48 (all 0.1 uF) as shown.

Each of the 1 K$\Omega$ resistors 22, 24, 36, 38, 50 and 52 are tied between an amplifier input and a reference voltage provided by the ECL line receiver chip MC10116. The reference voltage is 3.4 volts, which is lower than the five volt system supply level to give the output signal a relative ECL level. Because the Motorola TM ECL line receiver chip MC10116 is well known to those skilled in the art, it will not be further described herein.

The output of the ECL line receiver 21 on line 60 is a clean, square and robust ECL level data signal that may be used by an information system of a type known to those skilled in the art in which this invention may be implemented.

In the circuitry shown, a transistor amplifier including transistor 80 (e.g., 2N3906) is coupled to the output line 60 for conversion of the ECL level signal on line 60 to a TTL level signal on line 88. The collector of transistor 80 is coupled to a five volt power supply through resistor 82 (36 $\Omega$) connected in parallel with capacitor 86 (33 pF). Resistor 84 (110 $\Omega$) couples the emitter of transistor 80 to ground. With the values of resistors 82 and 84 given, the output of transistor 80 on line 88 is a TTL level signal compatible for use with TTL circuitry.

This invention represents a significant improvement in signal recovery and is preferably implemented in a LAN electro-optical interface system with the transmitter described in the above-mentioned copending application, U.S. Ser. No. 07/782,176. The above decibel increases and distance increases are exemplary of implementation of this invention into a 660 nm POF system. The invention is also suitable for use in other LAN optical fiber systems, including glass optical fiber systems. No change to this invention need be made to implement this invention in glass optical fiber systems, which typically use a 820 nm transmission frequency of light. The transmission-reception distance for glass optical fiber systems is much greater than that of the POF system described above.

The values for the specific components given above are just one example implementation of this invention. The component values in other implementations may be varied as the implementation requires. Additionally, equivalents known to those skilled in the art may be substituted for the above described components in implementation of this invention. Various other improvements and modifications to this invention may occur to those skilled in the art and will fall within the scope of this invention as set forth below.

The embodiments of the invention in which an exclusive property of privilege is claimed are defined as follows:

1. An apparatus coupled between an analog receiver and a line receiver means, comprising:
   first filter means for receiving an electrical signal from the analog receiver and for first filtering the electrical signal, filtering low frequency noise from the electrical signal while passing data signals contained in the electrical signal, the data signals having a data frequency, the first filter means outputting a first filtered signal at a first filter output;
   amplification means, connected to the output of the first filter means, for amplifying the first filtered signal, outputting, as a result, an amplified signal;
   second filter means, coupled between the amplification means and the line receiver means, for receiving the amplified signal and for second filtering the amplified signal to filter high frequency noise from the amplified signal while passing data signals contained in the amplified signal, the second filter means outputting a second filtered signal to the line receiver means, which, in response thereto, outputs a robust square signal, whereby the sensitivity of the system is increased,
   wherein the first filter means comprises
   a parallel circuit including a first resistor connected in parallel with a capacitor, the parallel circuit having a first connection and a second connection, the first connection coupled to the output of the analog receiver and the second connection coupled to the amplification means; and
   a second resistor connected between the second connection of the parallel circuit and ground,
   whereby the first filter means comprises a first order high pass filter having a break frequency below the data frequency and operational to attenuate low frequency noise, which comprises all frequencies below the break frequency, whereby the first filter means decreases a bit error rate of the apparatus and increases sensitivity of the system.

2. An apparatus coupled between an analog receiver and a line receiver means, comprising:
   first filter means for receiving an electrical signal from the analog receiver and for first filtering the electrical signal, filtering low frequency noise from the electrical signal while passing data signals contained in the electrical signal, the data signals having a data frequency, the first filter means outputting the first filtered signal at a first filter output;
   amplification means, connected to the output of the first filter means, for amplifying the first filtered signal, outputting, as a result, an amplified signal;
   second filter means, coupled between the amplification means and the line receiver means, for receiving the amplified signal and for second filtering the amplified signal, filtering high frequency noise from the amplified signal while passing data signals contained in the amplified signal, the second filter means outputting the second filtered signal to the line receiver means, which, in response thereto, outputs a robust square signal, whereby the sensitivity of the system is increased
   wherein the amplification means comprises
   a high gain transistor amplifier, coupled between the first filter means and the second filter means, including a transistor and biasing resistors, whereby the amplification means increases system sensitivity.

3. An apparatus coupled between an analog receiver and a line receiver means, comprising:
   first filter means for receiving an electrical signal from the analog receiver and for first filtering the electrical signal, filtering low frequency noise from the electrical signal while passing data signals contained in the electrical signal, the data signals having a data frequency, the first filter means outputting the first filtered signal at a first filter output;
   amplification means, connected to the output of the first filter means, for amplifying the first filtered signal, outputting, as a result, an amplified signal;
   second filter means, coupled between the amplification means and the line receiver means, for receiving the amplified signal and for second filtering the amplified signal, filtering high frequency noise from the amplified signal while passing data signals contained in the amplified signal, the second filter means outputting the second filtered signal to the line receiver means, which, in response thereto, outputs a robust square signal, whereby the sensitivity of the system is increased
   wherein the second filter means comprises
   a series circuit including a resistor and a capacitor connected in series, the series circuit coupled between a voltage source and ground, an output of the amplification means connected to the connection between the resistor and capacitor, wherein the series circuit comprises a low pass filter having a break frequency above the data frequency and operational to attenuate high frequency noise characterized as all frequencies above the break frequency and whereby the second filter means decreases a bit error rate of the apparatus and increases sensitivity of the system.

4. An apparatus coupled between an analog receiver and a line receiver means, comprising:
   a parallel circuit including a first resistor connected in parallel with a first capacitor, the parallel circuit having a first parallel circuit connection and a second parallel circuit connection, the first connection coupled to an output of the analog receiver;
   a second resistor connected between the second connection of the parallel circuit and ground;
   a high gain transistor amplifier, coupled to the second connection of the parallel circuit, including a transistor and third and fourth resistors for biasing a base of the transistor;
   a series circuit including a fifth resistor and a second capacitor connected in series, the series circuit coupled between a voltage source and ground, the connection between fifth resistor and the second capacitor coupled to a collector of the transistor,
   whereby the parallel circuit, second resistor, and series circuit act as a band pass filter having a first break frequency below a data frequency and a second break frequency above the data frequency and operational to attenuate low frequency noise and high frequency noise, wherein low frequency noise comprises all frequencies below the first break frequency and high frequency noise comprises all frequencies above the second break frequency, and whereby the band pass filter decreases a bit error rate of the apparatus and increases sensitivity of the system, and whereby the high gain amplifier increases system sensitivity.

* * * * *